(12) United States Patent
Bolkin et al.

(10) Patent No.: US 6,798,057 B2
(45) Date of Patent: Sep. 28, 2004

(54) THIN STACKED BALL-GRID ARRAY PACKAGE

(75) Inventors: Todd O. Bolkin, Star, ID (US); Chad A. Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/288,180

(22) Filed: Nov. 5, 2002

(65) Prior Publication Data

US 2004/0084771 A1 May 6, 2004

(51) Int. Cl.$^7$ ................................................. H01L 23/02
(52) U.S. Cl. ......................... 257/686; 257/637; 257/638
(58) Field of Search ................................ 257/692–676, 257/773–737

(56) References Cited

U.S. PATENT DOCUMENTS 5,744,827 A * 4/1998 Jeong et al. ................. 257/686
6,137,164 A * 10/2000 Yew et al. .................. 257/686
6,339,254 B1 * 1/2002 Venkateshwaran et al. . 257/686

* cited by examiner

Primary Examiner—Dung A. Le
(74) Attorney, Agent, or Firm—Snell & Wilmer LLP

(57) ABSTRACT

A thin-stacked ball grid array (BGA) package is created by coupling a semi-conducting die to each of the opposing faces of an interposer having bond pads and circuitry on both faces. Solder balls on either side of each die and/or the interposer provide interconnects for stacking packages and also provide interconnects for module mounting. Each die may be electrically coupled to the interposer using wire bonds, "flip-chip" techniques, or other techniques as appropriate. A redistribution layer may also be formed on the outer surface of a bumped die to create connections between the die circuitry, ball pads and/or wire bonding pads. Because the two die are coupled to each other on opposite faces of the interposer, each package is extremely space-efficient. Individual packages may be stacked together prior to encapsulation or molding to further improve the stability and manufacturability of the stacked package.

13 Claims, 4 Drawing Sheets

THIN STACKED BALL-GRID ARRAY PACKAGE

TECHNICAL FIELD

The present invention relates, generally, to semiconductor device packaging and, more particularly, to the fabrication of advanced stacked-die semiconductor packages, manufacturability, and the like. In this regard, a major trend in semiconductor packaging is toward low-profile, high-density device packages such as chip-scale and stacked-die packages.

BACKGROUND OF THE INVENTION

Recent advances in semiconductor fabrication techniques have dramatically increased the density and speed of semiconductor devices, leading to a concomitant effort in the field of semiconductor packaging, where increased device density gives rise to many challenges related to electrical connectivity, heat-transfer, manufacturability, and the like. In this regard, a major trend in semiconductor packaging is toward low-profile, high-density device packages such as chip-scale and stacked-die packages.

A typical stacked-die package includes two or more semiconductor devices configured in a stack—one on top of the other—with bond wires leading from bond pads on the first device to bond pads on the second. The bottom-most die in the stack is typically bonded to a suitable substrate, for example, a ball grid array (BGA) or fine ball grid array (FBGA) substrate, and bond wires are provided between bond-pads on the package substrate to one or more of the die in the stack. The BGA substrate typically includes an array of solder balls which provide, electrical connectivity to external devices. In this way, a relatively dense, low-profile semiconductor package can be manufactured.

Currently-known stacked-die packages are unsatisfactory in a number of respects, however. For example, the packages remain inordinately large for many applications such as portable electronics, cellular phones, digital cameras, personal digital assistants (PDAs), global positioning systems, and the like. Moreover, the effort and expense to assemble many conventional stacked BGA packages can be significant, since each layer of the stack is typically assembled and sealed prior to assembly into the stack. New devices and methods are therefore needed to overcome these and other limitations of the prior art. Specifically, there is a need for an improved and highly manufacturable stacked-die package.

SUMMARY OF THE INVENTION

According to various embodiments of the invention, a thin-stacked ball grid array (BGA) package is created by coupling a semi-conducting die to each of the opposing faces of an interposer having bond pads and circuitry on both faces. Solder balls on either side of each die and/or the interposer provide interconnects for stacking packages and also provide interconnects for module mounting. Each die may be electrically coupled to the interposer using wire bonds, "flip-chip" techniques, or other techniques as appropriate. In a further embodiment, a redistribution layer is formed on the outer surface of a bumped die to create connections between the die circuitry, ball pads and/or wire bonding pads. Because the two die are coupled to each other on opposite faces of the interposer, each package is extremely space-efficient. Individual packages may be stacked together prior to encapsulation or molding to further improve the stability and manufacturability of the stacked package.

BRIEF DESCRIPTION OF THE DRAWINGS

The features and advantages of the present invention are hereinafter described in the following detailed description of illustrative embodiments to be read in conjunction with the accompanying drawing figures, wherein like reference numerals are used to identify the same or similar parts in the similar views, and.

DETAILED DESCRIPTION OF EXEMPLARY EMBODIMENTS

According to various embodiments of the invention, the shortcomings of the prior art are overcome by providing an ultra-thin package that is capable of being stacked with other like packages. Each package contains an interposer connecting two or more die in a face-to-face arrangement on opposite sides of the interposer. Electrical interconnects between packages are provided by solder balls similar to those used in conventional ball-grid array packages. To improve ease-of-manufacturing, the entire stack may be encapsulated or otherwise protected without the need to encapsulate individual packages. Various modifications and other embodiments will become apparent from the following descriptions of exemplary embodiments, which are intended to be read in conjunction with the attached drawing figures.

The present invention may be described herein in terms of functional block components and various processing steps. For the sake of brevity, conventional integrated circuit manufacturing and design techniques, as well as chip development and other functional aspects of the systems (and components of the individual operating components of the systems) may not be described in detail herein. Various embodiments of the present invention could employ any number of conventional techniques for electronics configuration, signal processing, semiconductor/package fabrication and the like. Moreover, the packages and devices disclosed herein may be readily modified in other embodiments through application of general electrical, mechanical and electronic principles.

Figure 1:
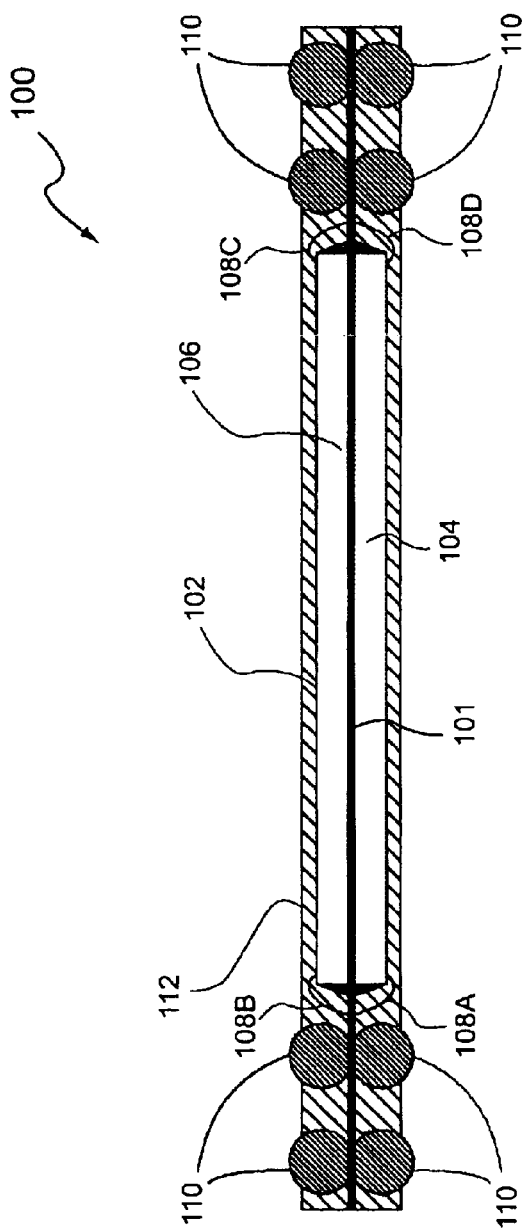
FIG. 1 is a schematic view of an exemplary stackable ball grid array package arrangement.

Referring now to the cross-sectional overview shown in FIG. 1, a stacked die package 100 in accordance with one embodiment of the present invention generally includes a first die 102 and a second die 104 attached to a silicon or plastic interposer 101 as appropriate. Interposer 101 suitably includes circuitry to provide electrical interconnects between the two dies 102 and 104, and to interface balls 110. Interface balls 110 provide electrical contacts to an external substrate (described below), another package 100, test device, power source and/or other component. Dies 102 and 104 are mechanically bonded to interposer 101 by an epoxy or other suitable adhesive 106, and are electrically interconnected to interposer 101 by wire interconnects 108A–D, or through any other appropriate technique. The entire package 100 may be encased in an encapsulate 112, as appropriate, to mechanically support package 100, to allow thermal expansion and contraction, and to prevent contaminants from coming into contact with dies 102 and 104. In various embodiments, a portion of each interface ball 110 is exposed from encapsulate 112 to provide an, external interface to dies 102 and 104.

Each die 102 and 104 may be fabricated using any suitable semiconductor material upon which or within which electronic components may be formed. Suitable materials for dies 102 and 104 include, for example, group IV semiconductors (i.e., Si, Ge, and SiGe), group III–V semiconductors (i.e., GaAs, InAs, and AlGaAs), and other less-conventional materials, such as SiC, diamond, and sapphire. Dies 102 and 104 may include single crystal material, a silicon-on-insulator material (SOI), or one or more polycrystalline or amorphous epitaxial layers formed on a suitable base material. It will be appreciated that dies 102 and 104 will also include various electronic components incorporated into the semiconductor material as well as interconnect structures consisting of conductive paths and various dielectrics for isolating these conductive paths. In this regard, the present invention is not limited to a particular class of electronic components. That is, dies 102 and 104 may include any combination of digital and/or analog semiconductor devices, including, for example, microprocessors, microcontrollers, application specific integrated circuits (ASICs) static or dynamic memory devices, integrated optic devices, integrated sensors, field-effect transistor power semiconductors and/or the like. In one embodiment, for example, first die 102 is an ASIC device and second die 104 is a flash memory device. Alternatively, either or both of die 102 and 104 may be fabricated as an optical, microelectronic machined (MEMS) or other device or component.

Interposer 101 provides an electrical intermediary within package 100 (i.e., between first die 102 and second die 104) to which wire bonds may be formed. In general, a plastic interposer 101 in accordance with the present invention includes a number of external bond pads connected by a set of conductive traces. The positions of the bond pads on interposer 101 may be selected to minimize the occurrence of crossing and interleaved bond-wires. Further, interposer 101 may include appropriate circuitry such as busses, interconnects and the like to provide appropriate electrical and/or electronic signals between dies 102/104 and interface balls 110. Interposer 101 may be formed of plastic, silicon, glass, or any other material suitable for the particular embodiment. Dies 102 and 104 may be affixed to interposer 101 using any appropriate adhesive 106.

A number of bond pads may be provided on each die 102/104 and/or on interposer 101. Bond pads are typically coupled to external leads, pins, solder balls, or the like thereby providing electrical connectivity to external components, power sources, etc. Bond pads provide connectivity to the various semiconductor devices (not shown) formed on and/or within dies 102 and 104. Each of the bond pads provides a predefined area—typically an exposed area formed of a conductor such as aluminum or copper—to which wire bonds may be secured to provide electrical connectivity with the appropriate semiconductor components, vias, metal-traces, etc. formed on the semiconductor devices, interposer, and package substrate. Such bond pads are well known in the art, and will not be discussed in detail herein.

Bond wires 108A–D are formed to provide electrical connectivity between the various bond pads on dies 102/104 and on interposer 101. The bond wires may be formed using a variety of materials and any convenient bonding techniques, e.g., thermal-compression bonding. Suitable bond wire materials include, for example, gold, gold-beryllium, aluminum, and aluminum alloys (e.g., Al—Mg—Si, Al—Si, Al—Mg, Al—Cu). The diameter of the wires may range from about 15 microns to about 75 microns. Addition information regarding bond wires, wire-bonding, and a number of other basic packaging techniques (including ball grid array packaging) may be found in a number of standard texts, e.g., Seraphim, Lasky, and Li, PRINCIPLES OF ELECTRONIC PACKAGING (1989).

Interface balls 110 are appropriately formed to provide an external electrical interface for package 100. Interface balls 110 may be formed with any convenient material (e.g. any type of solder such as any alloy of tin, lead or other materal, using any appropriate technique. In an exemplary embodiment, each of the interface balls 110 are approximately 0.5–2 millimeters in diameter, although other dimensions could be used in other embodiments. Interface balls 110 are placed at any convenient position on interposer 101 to create a desired footprint (such as a BGA footprint) for package 100. Each interface ball is appropriately located on a bond pad on interposer 101 to provide an electrical interface as described above. Although the interface balls 110 are shown in the Figure to be approximately spherical in shape, any other geometric layout (such as cylindrical, pyramidal, or any other shape) could be used in alternate embodiments.

Encapsulant 112 is formed about package 100 to mechanically and thermally seal the package, and to prevent contaminants from coming into contact with dies 102 and 104. Encapsulant 112 is suitably formed of any plastic, resin, epoxy, rubber or other sealing material. Several exemplary molding techniques for forming encapsulant 112 on package 100 are described more fully below.

In operation, dies 102 and 104 provide any appropriate data storage or processing function. Dies 102 and 104 may be used to implement digital memories, application specific integrated circuits (ASICs), processing circuitry, or the like. Each die 102/104 communicates with the other die and with the interface balls 110 via interposer 101, which is communicatively coupled to each die with one or more bond wires 108A–D. Because each of the dies 102/104 is affixed to one of the opposing sides of interposer 101, the resulting design is spatially efficient, and provides a very compact package 100 that can be stacked to create modules, as described more fully below.

Figure 2:
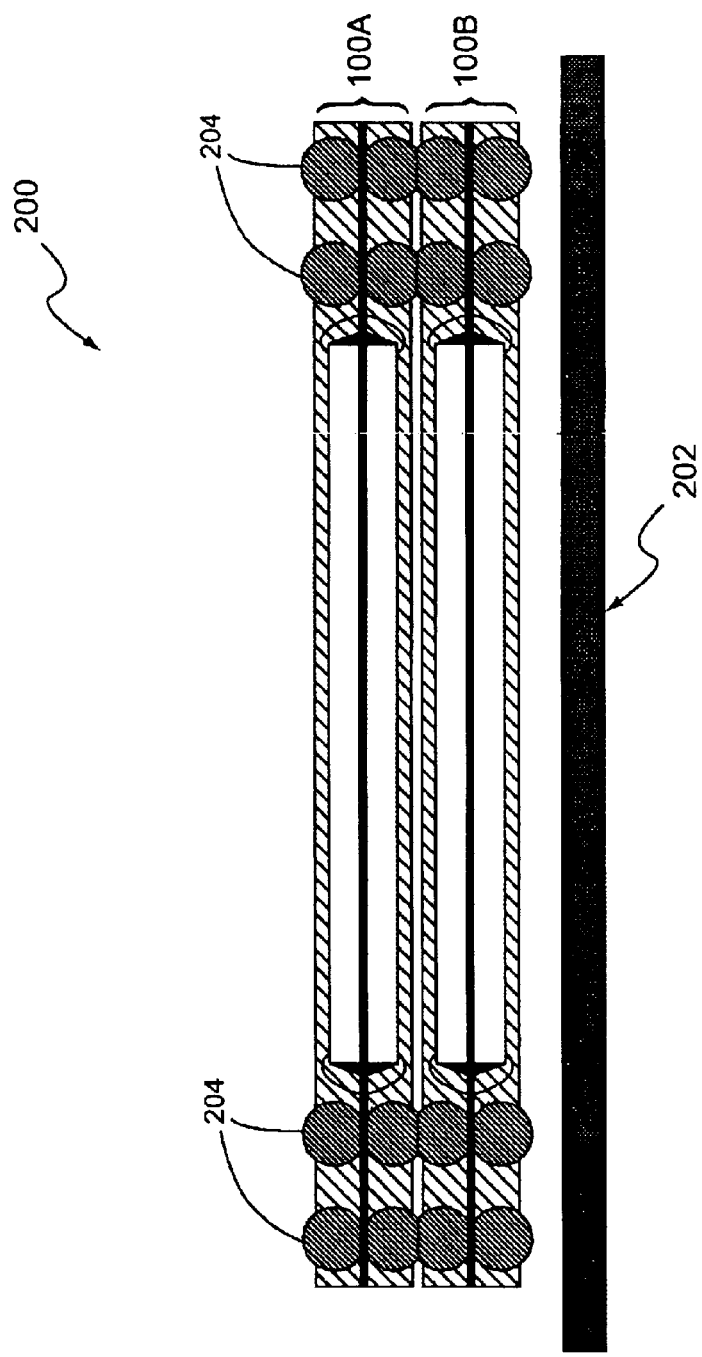
FIG. 2 is a schematic cross-sectional view of an exemplary stacked-die package incorporating the stackable packages described in FIG. 1.

With reference now to FIG. 2, an exemplary stacked module 200 suitably includes two or more packages 100A–B in electrical communication with each other and with a package substrate 202, such as a printed circuit board. Each of the packages 100A–B may be created as described above in conjunction with FIG. 1. The packages are appropriately joined together and to package substrate 202 by simply aligning the interface balls 110 on the packages 100A–B and affixing the packages together through any appropriate technique (e.g., soldering). The exposed portions 204 of interface balls 110 may remain exposed for testing or external interface purposes, or may be further protected with encapsulant 112 (FIG. 1) or the like.

Package substrate 202 provides an area to which packages 100 may be mounted, and also provides electrical connectivity to any external power sources and components. In this regard, package substrate 202 is frequently implemented as a printed circuit board (PCB) or other appropriate substrate.

Various embodiments may therefore be used in connection with a wide variety of packages, e.g. ball-grid arrays (BGAs), chip-scale packages (CSPs) thin quad flat-packs (TQFPs), thin small outline packages (TSOPs), and/or any other package which includes a package substrate, such as a proprietary or custom package footprint. Depending upon the particular application, package substrate 202 may include rigid board materials (e.g., FR-4 and BT), ceramics, polyimide flex circuits, metallic leadframes or any other suitable material. In one embodiment, package substrate 202 is a BGA substrate fabricated using a glass-filled resin, a polyimide glass, or a cyanate-glass material.

In operation, then, stacked module 200 suitably provides a memory module or other component in an easily-stackable configuration. By forming individual modules 100A–B having an appropriate footprint for the desired substrate 202, the techniques described herein may be readily modified and adapted to suit any desired footprint or application.

Figure 3:
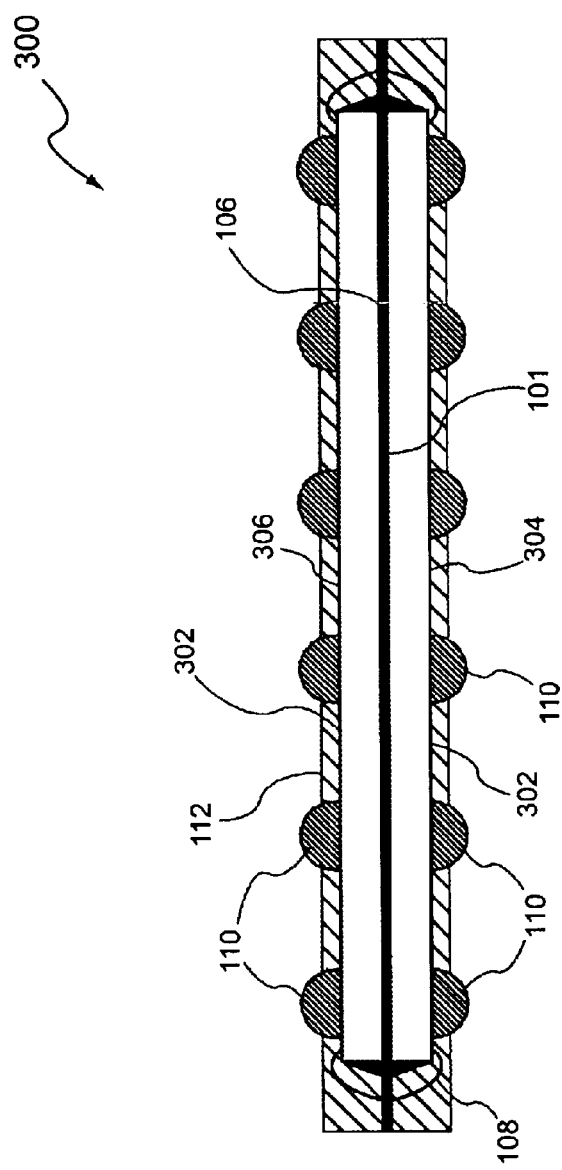
FIG. 3 is a schematic view of a second exemplary stackable ball grid array package arrangement.

With reference now to FIG. 3, an alternate embodiment of a stackable package 300 suitably includes two bumped die 304 and 306 affixed to the opposing sides of an interposer 101. Each of the dies 304/306 may be provided with an appropriate redistribution layer 302 to provide a direct electrical interface between each die 304/306 and some or all of the interface balls 110. This embodiment provides even greater flexibility in creating desired footprints for module 300, since placement of interface balls 110 is not restricted to locations where direct contact with interposer 101 are available.

Exemplary bumped die techniques are known from direct chip attach (DCA, i.e. "flip-chip") technologies wherein conductive "bumps" on die bond pads provide direct electrical connections to substrates, circuit boards, and the like. Bumped dies may be incorporated into the present invention by, for example, affixing the back (or "non-bumped") side of the die to interposer 101 using any adhesive as described above, and by providing a redistribution layer of an appropriate conductive material (such as copper or aluminum) to electrically couple the die "bumps" to interface balls 110 as appropriate. In an exemplary embodiment, redistribution layers 302 are formed on dies 304 and 306 using deposition, etching and/or any other appropriate techniques. As described in the embodiments above, interconnections between the interface balls 110 and/or dies 304/306 are suitably provided by interposer 101 and wire interconnects 108, as well as by redistribution layers 302. The entire package 300 may be protected with an encapsulant material 112, as described above. In various embodiments, at least a portion of each interface ball is exposed from the encapsulant 112 to form an electrical interface to dies 304 and 306 as appropriate.

Figure 4:
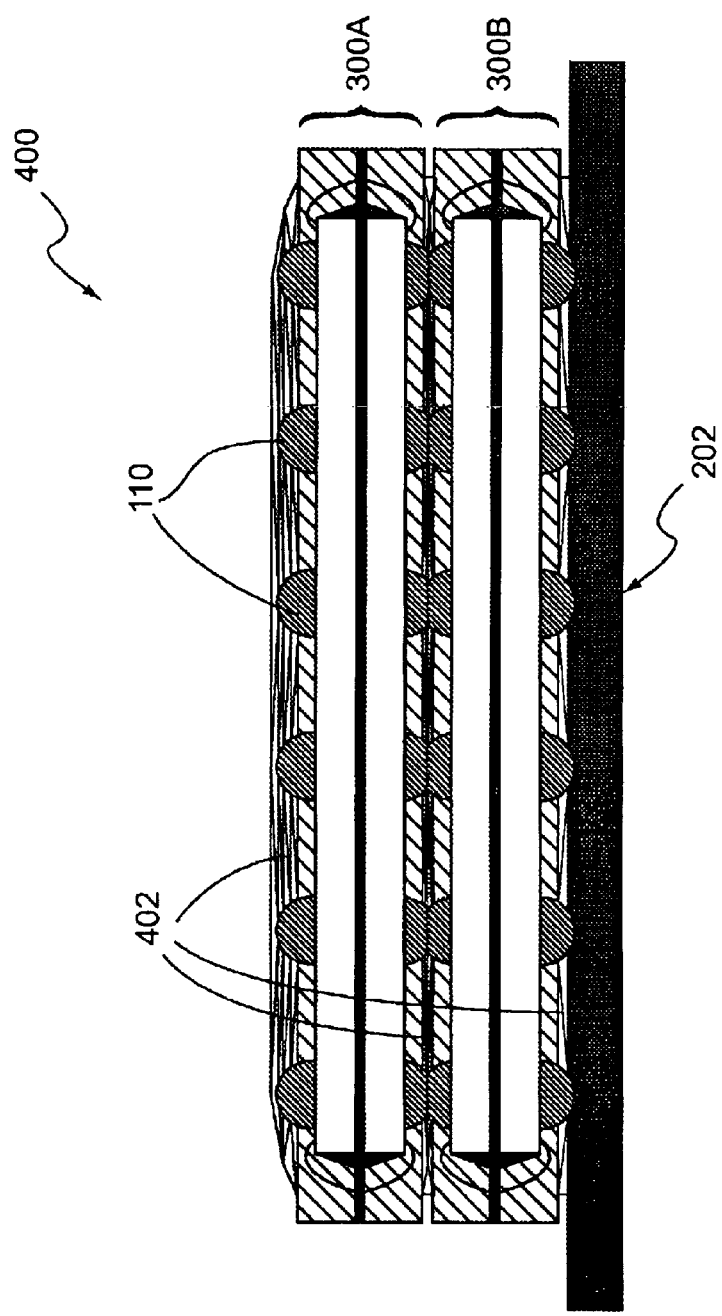
FIG. 4 is a schematic cross-sectional view of an exemplary stacked-die package incorporating the stackable packages described in FIG. 3.

With reference now to FIG. 4, a stacked module 400 suitably includes two or more packages 300A–B aligned such that the interface balls 110 of the packages 300A–B align and cooperate to provide an electrical interface between the packages. The module 400 may be coupled to any appropriate substrate 202 (such as a printed circuit board), and an underfill 402 may also be provided to further protect and support the module 400. Underfill 402 is suitably implemented with any appropriate material such as epoxy, plastic, resin or the like. Although FIG. 4 shows the uppermost interface balls 110 of module 400 as being covered by underfill 402, in alternate embodiments some or all of interface balls 110 may remain exposed to facilitate testing, signal interconnects, or the like.

Stackable packages 100/300 may be manufactured according to any technique. Referring again to FIG. 1, a method of fabricating a multi-die stackable package will now be described. Initially, a suitable interposer 101 is provided. As mentioned above, package interposer 101 may be made of plastic, silicon or the like, and typically includes circuitry to electrically inter-connect dies 102/104 and other components of package 200. Each of the dies 102/104 are suitably bonded to interposer 101 using an adhesive 106 such as an epoxy paste or adhesive tape. This step typically involves applying the adhesive material 106 on interposer 101, and then using a pick-and-place operation to position dies 102 and 104 against the adhesive layer 106 as appropriate.

After dies 102/104 are adhered to interposer 101, wire bonds 108A–D are formed to connected each die 102/104 to interposer 101 as appropriate. Wire bonds 108A–D are formed according to any conventional technique previously known or subsequently developed. In an exemplary embodiment, a bond pad is formed on the die 102/104 and on interposer 101 such that an interconnect wire can be appropriately connected to the pad using an adhesive, tape, solder or other connecting technique. Each die bond may also require a cleaning and/or curing step, as appropriate.

Various wire bonds 108A–D (including stitch-bonds, etc.) may be formed between any pair of devices in the package. For example, it is likely that a given device might include wire bonds extending from each die 102/104 to interposer 101. The order in which wirebonding takes place may be selected in accordance with the geometry of the stack and other design factors. As mentioned above, the bond wires may be formed using a variety of materials and any convenient bonding techniques, e.g., thermal-compression molding. Solder or other interface balls 110 may similarly be placed on bond pads after the dies 102/104 are placed, or at any other convenient time, by simply placing an appropriate amount of solder on the bond pad to create a ball 110.

After the wire bonds are in place, the die and bonds are encapsulated using any appropriate technique such as compression or transfer molding. In an exemplary embodiment, a compliant material such as a tape or film is used to ensure that portions of the interface balls 110 remain exposed after the encapsulation process is complete. In a compression molding process, for example, a compliant material is placed in the lower cavity of the mold, with a desired encapsulant material loaded onto the compliant material. A die assembly of interposer 101 with the two dies 102/104, appropriate bond wires 108A–D, and interface balls 110 is placed on the encapsulant, and a second encapsulant layer is placed on top of the assembly. A final layer of compliant material is then provided on the top of the mold, and the entire mold contents are subjected to pressure and heat to encapsulate the package 100. After molding, the compliant material is removed to expose the outer contacts of interface balls 110.

Similarly, an exemplary transfer molding process for encapsulating packages 100 or stacks 200 suitably includes providing a compliant material along the top and bottom cavities of the mold. The die assembly (i.e. the interposer with attached die and any bond wires and/or interface balls) is suitably loaded and clamped within the die set. Encapsulant material is then transferred into the package or stack, as appropriate. After molding, the compliant material is discarded to expose the outer surfaces of interface balls 110. In a still further embodiment, the compliant material is omitted from the compression or transfer mold, and excess encapsulant 112 covering interface balls 110 is suitably ground away, etched or otherwise removed from the appropriate locations of the resulting package or stack.

With momentary reference to FIG. 3, similar processes could be used to create the multi-die stackable packages 300 shown therein. In such embodiments, redistribution layer 302 may be formed on each bumped die 304/306 prior to attaching the die to interposer 101. In a further embodiment, interface bumps are created on both opposing faces of dies 304/306 such that "flip chip" techniques can be used to provide an electrical interface between the dies and interposer 101. In such embodiments, wire bonds 108A–D may not be required. Accordingly, "flip chip" and wire bonding techniques and structures may be intermixed in any manner in various alternate embodiments.

Various modifications to the above process could be made without departing from the scope of the invention. Each die could be individually processed, for example, such that the adhesive, wire bonding and encapsulation steps for each die take place prior to processing of the die on the opposite side of interposer 101. Alternatively, the various packages 100/300 could be placed together or joined to form a stack 200/400 either before or after the molding process. Multiple packages 100/300 may therefore be encapsulated simultaneously to form stacked devices 200/400. Similarly, the various processing steps may be intermingled in any way according to design variations and to improve ease of manufacturability.

Although the invention has been described herein in conjunction with the appended drawings, it will be appreciated that the scope of the invention is not so limited. For example, while the present invention has been described in connection with one interposer sandwiched between two semiconductor dies, the present invention may be used with any number of dies, devices and interposers. For example, a series of three semiconductor devices having two interposers provided therebetween could be used. Similarly, although FIGS. 2 and 4 show stacked modules made up of two packages, any number of packages could be stacked to create a stacked module. Moreover, although the devices and techniques described herein have focused primarily on semiconductor devices and digital memories for purposes of simplicity, the same structures and techniques may be applied to numerous equivalent fields such as optics, MEMS, and the like. These and other modifications in the selection, design, and arrangement of the various components and steps discussed herein may be made without departing from the scope of the invention as set forth in the appended claims.

Further, the various techniques described herein for forming stackable packages and modules may be adopted or expanded in many ways. It should be appreciated that the particular implementations shown and described herein are examples of the invention and are not intended to otherwise limit the scope of the present invention in any way. The connecting lines shown in the various figures contained herein are intended to represent exemplary functional relationships and/or physical or logical couplings between the various elements. It should be noted that many alternative or additional functional relationships, physical connections or logical connections may be present. The corresponding structures, materials, acts and equivalents of all elements in the claims below are intended to include any structure, material or acts for performing the functions in combination with other claimed elements as specifically claimed. Moreover, the steps recited in any method claims may be executed in any order. The scope of the invention should be determined by the appended claims and their legal equivalents, rather than by the examples given above. No item or component is essential to the practice of the invention unless the element is specifically described herein as "essential" or "critical".

What is claimed is:

1. A stackable semiconductor package comprising:
   an interposer having two opposing sides;
   two die, each die being attached to one of the two opposing sides of the interposer and being electrically coupled to the interposer by at least one wire interconnect;
   a plurality of interface balls, each interface ball being electrically coupled to one of the die, wherein at least one of said interface balls is adjacent to a first side of said interposer and at least one of said interface balls is adjacent to a second side of said interposer, and
   an encapsulating material disposed around the two die and the interposer, wherein at least a portion of each of the plurality of interface balls is exposed from the encapsulating material to form an external electrical interface to the two die.

2. The package of claim 1 further comprising a redistribution layer formed on a surface of each die opposite the interposer.

3. The package of claim 2 wherein the redistribution layer comprises an interface ball pad forming an interface between the die and one of the interface balls.

4. The package of claim 2 wherein the redistribution layer comprises a wire bond pad forming an interface between the die and one of the wire interconnects.

5. The package of claim 1 wherein the plurality of solder balls is disposed on the interposer, and wherein the interposer is configured to electrically couple each of the interface balls to one of the die.

6. A stacked semiconductor module comprising first and second stackable packages, wherein each stackable package comprises:
   an interposer having two opposing sides;
   two semi-conducting die, each die being coupled to one of the two opposing sides of the interposer and being electrically coupled to the interposer by at least one wire interconnect;
   a plurality of solder balls, each solder ball being electrically coupled to one of the die, wherein at least one of said solder balls is adjacent to a first side of said interposer and at least one of said solder balls is adjacent to a second side of said interposer; and
   an encapsulating material disposed around the two semi-conducting die and the interposer, wherein at least a portion of each of the plurality of solder balls is exposed from the encapsulating material to form an electrical interface to the two semi-conducting die; and
   wherein each of a portion of the solder balls associated with the first stackable package is electrically coupled to one of the solder balls associated with the second stackable package to form an electrical connection therebetween.

7. The stacked semiconductor module of claim 6 wherein each of a second portion of the solder balls associated with the first stackable package is coupled to a printed circuit board.

8. The stacked semiconductor module of claim 7 wherein a third portion of the solder balls associated with the second stackable package is exposed from the stackable semiconductor package.

9. The stacked semiconductor module of claim 6 further comprising an underfill disposed between first and second stackable packages.

10. The stacked semiconductor module of claim 7 further comprising an underfill disposed between first and second stackable packages and between the first stackable package and the printed circuit board.

11. A stackable memory package comprising:

an interposer having two opposing sides;

two die, each die being mechanically coupled to one of the opposing sides by an adhesive, and wherein each die is electrically coupled to the interposer by a wire interconnect;

a plurality of interface balls, each of the interface balls being electrically coupled to at least one of the die, wherein at least one of said interface balls is adjacent to a first side of said interposer, and at least one of said interface balls is adjacent to a second side of said interposer; and an encapsulate enclosing the two die but allowing at least a portion of each interface ball to protrude from the encapsulate.

12. A stackable memory package comprising:

an interposer having two opposing sides;

two semiconducting die, each die being mechanically coupled to one of the opposing sides by an adhesive, and wherein each die is electrically coupled to the interposer by a wire interconnect;

a plurality of solder balls, each ball being disposed upon the interposer to form an electrical connection between each ball and one of the die, wherein at least one of said interface balls is adjacent to a first side of said interposer, and at least one of said interface balls is adjacent to a second side of said interposer; and an encapsulate enclosing the stackable memory package but allowing at least a portion of each solder ball to protrude from the encapsulate.

13. A stacked semiconductor module comprising first and second stackable packages, wherein each stackable package comprises:

a means for supporting two semi-conducting die in a face-to-face manner;

a plurality of means for providing an external electrical interface to one of the die;

means for electrically coupling the die to the plurality of providing means, and means for encapsulating the two semi-conducting die such that at least a portion of each of the plurality of providing means is exposed from the encapsulating means to form an external electrical interface to the two semi-conducting die; and wherein each of a portion of the plurality of providing means associated with the first stackable package is electrically coupled to one of the providing means associated with the second stackable package to form an electrical connection therebetween.

* * * * *